United States Patent [19]

Kirkpatrick

[11] 4,082,958

[45] Apr. 4, 1978

[54] APPARATUS INVOLVING PULSED ELECTRON BEAM PROCESSING OF SEMICONDUCTOR DEVICES

[75] Inventor: Allen R. Kirkpatrick, Chelmsford, Mass.

[73] Assignee: Simulation Physics, Inc., Bedford, Mass.

[21] Appl. No.: 791,499

[22] Filed: Apr. 27, 1977

Related U.S. Application Data

[63] Continuation of Ser. No. 636,055, Nov. 28, 1975, abandoned.

[51] Int. Cl.² .............................................. H01J 37/30
[52] U.S. Cl. ............................. 250/492 B; 250/492 A
[58] Field of Search ................ 250/492 A, 492 B, 398

[56] References Cited

U.S. PATENT DOCUMENTS

| | | | |
|---|---|---|---|
| 2,906,679 | 9/1959 | Lawton | 250/492 B |
| 3,066,238 | 11/1962 | Arndt | 250/492 B |
| 3,144,552 | 8/1964 | Schonberg | 250/492 B |
| 3,406,304 | 10/1968 | Brewster | 250/492 B |
| 3,922,546 | 11/1975 | Livesay | 250/492 B |

Primary Examiner—Bruce C. Anderson
Attorney, Agent, or Firm—Morse, Altman, Oates & Bello

[57] ABSTRACT

A pulsed electron beam generator produces a short duration pulse of electrons in the form of a directed beam for thermal processing of a semiconductor device, which is positioned in a pulsed electron beam chamber so that the propagating electron beam impacts upon the device surface in selected regions of the device that are to be processed. Energy deposited by the impacting electron pulse momentarily elevates the temperature of the selected regions above threshold processing temperatures for rapid, effective annealing, sintering or other thermal processing. The characteristics of the electron beam pulse are such that only those surface vicinity regions to be processed are elevated to a high temperature, the remaining mass of the semiconductor device not being subjected to unnecessary or undesirable high temperature exposure.

5 Claims, 6 Drawing Figures

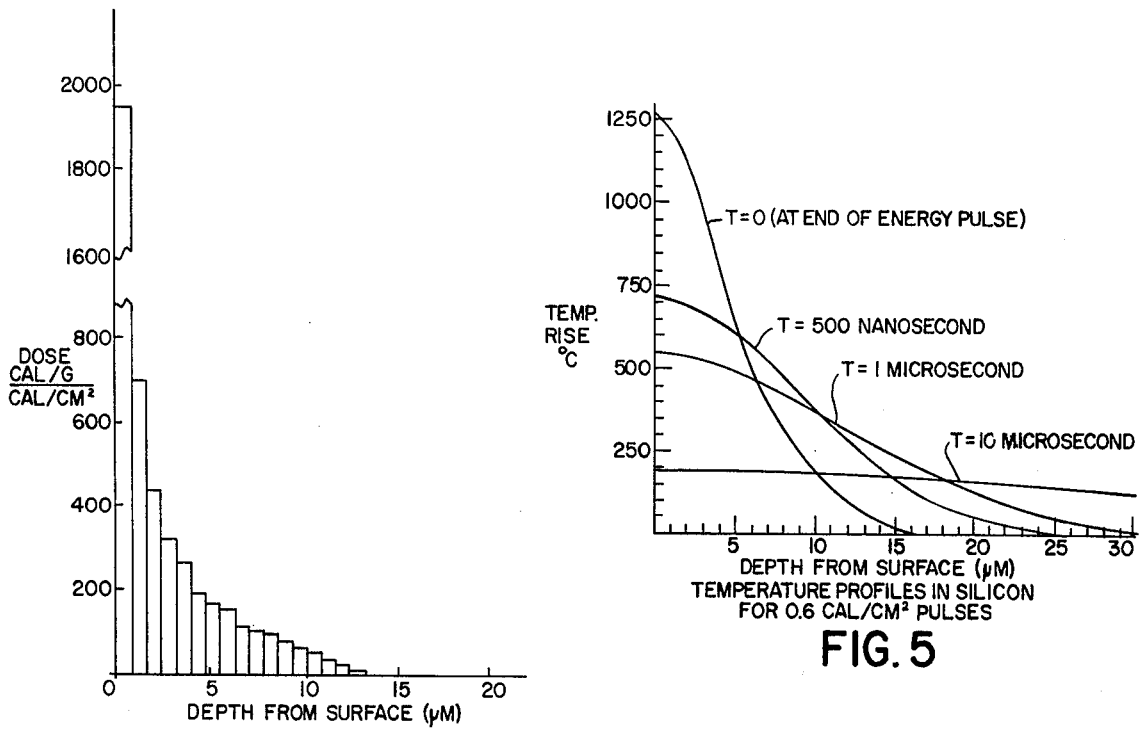
FIG. 4
FIG. 5
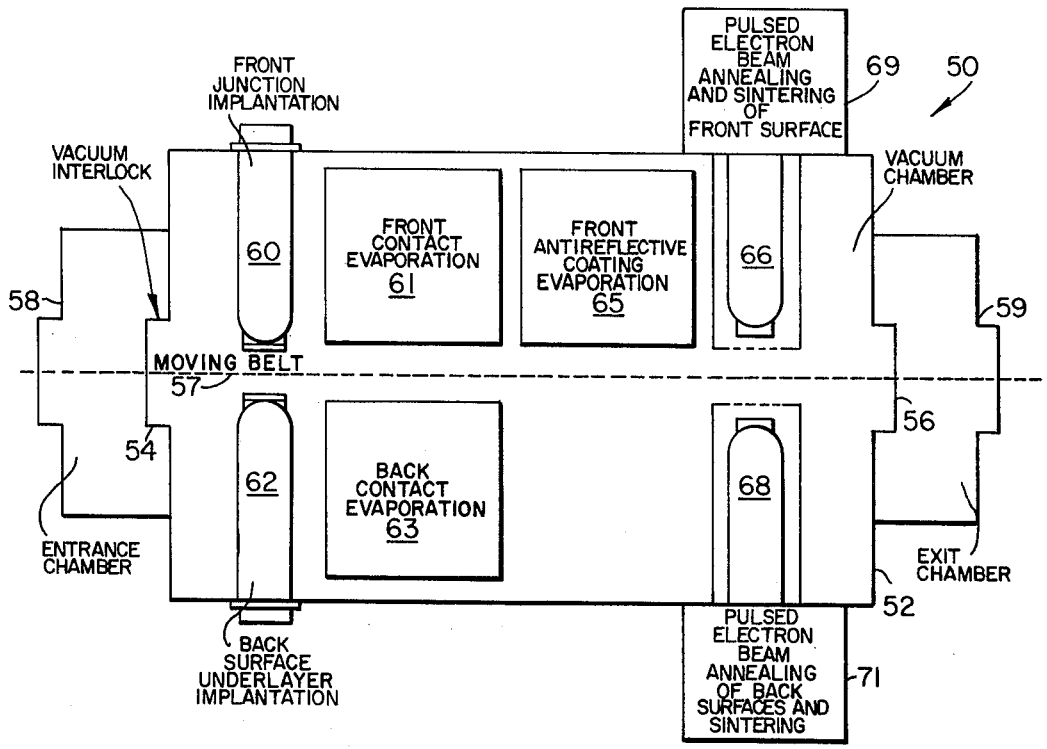
FIG. 6

4,082,958

APPARATUS INVOLVING PULSED ELECTRON BEAM PROCESSING OF SEMICONDUCTOR DEVICES

This is a continuation of application Ser. No. 636,055 filed Nov. 28, 1975 abandoned.

BACKGROUND OF THE INVENTION

1. Field of the Invention

The present invention relates to thermal processing of semiconductor devices and, more particularly, is directed towards a method and apparatus involving pulsed electron beam localized thermal processing of semiconductor devices.

2. Description of the Prior Art

Thermal processing has become a widely employed fabrication technique in the manufacture of semiconductor devices such as diodes, transistors, solar cells, integrated circuits and the like. Examples of commonly employed thermal processes include diffusion of dopant elements into semiconductor materials, annealing of crystalline structure after mechanical or radiation induced damage, annealing and electrical activation of dopant atoms after ion implantation, sintering of metallic and dielectric coatings to improve mechanical and optical properties.

Although it is desirable to influence only specific local regions of the device during individual processing steps, usually the regions in the vicinity of the surface, conventional thermal processing is performed by elevating the temperature of the entire device structure and by maintaining the temperature environment for an adequate period of time to produce the required thermal effects. Generally, thermal processing is performed in a furnace type facility for times ranging from a few minutes to several hours at temperatures less than 200° C to temperatures above 1000° C. Such techniques, in addition to being time and energy consuming, have had limited application due to the fact that many materials and device structures degrade as a result of the thermal exposures necessary for the processes. A need exists for an improved method and apparatus for rapid thermal processing of specific regions of a semiconductor device that does not cause deleterious effects in the region being processed and that does not significantly alter other regions of the semiconductor material.

SUMMARY OF THE INVENTION

A pulsed electron beam generator produces a pulse of electrons in a high intensity beam for thermal processing of a semiconductor device. The semiconductor device is positioned in a pulsed electron beam chamber so that the propagating electron beam impacts upon selected regions of the device surface, the electron beam chamber being evacuated to a pressure consistent with requirements for generation of the required electron pulse. Usually, the selected regions to be processed lie approximately within the electron penetration depth of the surface. In certain cases, the device surface includes additional metal, insulator or semiconductor films or areas as required for the device structure. The impacting electron beam pulse momentarily elevates the temperature of the region being processed above a threshold temperature at which the desired effect occurs. Upon completion of the electron pulse and achievement of peak temperature, the temperature profile relaxes back to an equilibrium level with a time constant that is related to geometry and material characteristics. The energy density of the electron pulse is sufficiently high to elevate the temperature of the selected region above the process threshold temperature without causing deleterious effects such as melting, vaporization, fracturing, and the like. The energy of the individual electrons is sufficiently low so as not to cause atomic displacements in the semiconductor material. The duration of the electron pulse is sufficiently short so that substantial temperature elevation occurs only in the vicinity of the surface region of the semiconductor device and other deeper regions or masked areas of the semiconductor device are not subjected to undesirable or unnecessary high temperature exposure.

It is therefore an object of the present invention to provide a method and apparatus involving pulsed electron beam thermal processing of specific regions of a semiconductor device or material without subjecting other regions of the semiconductor device or material to excessive thermal exposure.

Another object of the present invention is to provide a method and apparatus involving pulsed electron beam processing of a semiconductor device or material in which the temperatures of the specific regions being processed are momentarily elevated above a threshold temperature at which the required process effect takes place during the period of temperature elevation.

Another object of the invention is to provide a method and apparatus involving pulsed electron beam annealing for restoring structural and electrical parameters of a semiconductor material that has been subjected to radiation damage as a result of ion implantation of dopant impurities. Annealing is completed in a sufficiently short period of time so that the carefully controlled and steep dopant gradient profiles, which are achieved by ion implantation, are not altered by atomic migrations due to thermal diffusion.

Another object of the present invention is to provide a method and apparatus for annealing surface damage effects and for thermal sintering activation and optimization of mechanical, electrical and optical properties of surface conductive and insulating films such as electrical contacts, insulating layers, antireflective coatings, and the like, without allowing thermal diffusion of these materials and their components to occur below the surface region of the semiconductor device.

Still another and a further object of the present invention is to provide a method and apparatus involving pulsed electron beam processing for thermal fabrication processes on semiconductor devices using much reduced total energy expenditure relative to that necessary for conducting present thermal process operations.

Other objects of the present invention will be in part obvious and will in part appear hereinafter.

The invention accordingly comprises the methods and apparatuses, together with their parts, steps, elements and interrelationships that are exemplified in the following disclosure, the scope of which will be indicated in the appended claims.

BRIEF DESCRIPTION OF THE DRAWINGS

A fuller understanding of the nature and objects of the present invention will become apparent upon consideration of the following detailed description taken in connection with the accompanying drawings, wherein:

FIG. 4 is a graphical representation of dose versus depth energy deposition profiles in silicon for the particular electron pulse conditions of FIG. 2;

FIG. 5 is a graphical representation of temperature profiles in silicon for the electron pulse conditions of FIG. 2;

FIG. 6 is a schematic and block diagram of an examplary system embodying the present invention for ion implantation and pulsed electron beam processing of semiconductor devices.

DETAILED DESCRIPTION OF THE INVENTION

Figure 1:
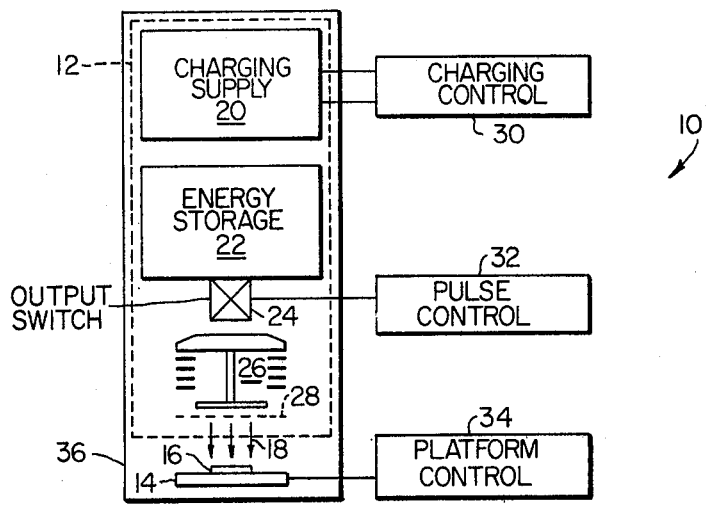
FIG. 1 is a schematic and block diagram of a system embodying the present invention for pulsed electron beam processing of semiconductor devices.

The present invention provides a method and apparatus for localized thermal processing of specific regions of a semiconductor device or material by momentarily elevating the temperature of the entire semiconductor. Thermal processing includes mechanical annealing, annealing and electrical activation of ion implanted material, annealing of radiation damage, sintering for electrical mechanical and optical characteristic improvement, short range atomic diffusion in the semiconductor, and the like. A short duration pulsed electron beam, which is generated by an electron beam generator, is directed towards the specific semiconductor regions to be processed. The effect of the short duration pulse impacting upon the semiconductor device, which may include surface coatings, components, and the like, is to momentarily elevate the temperature in the vicinity of the impacted region. The pulsed electrons incident upon the surface are absorbed as they penetrate the material. The desired thermal effect occurs when the temperature in the region to be processed exceeds a temperature threshold level, the temperature threshold level being related to the particular process effect desired and the semiconductor device material or materials involved. For certain processing effects, for example the annealing of the surface of a semiconductor material that has radiation damage caused by ion implantation, there is some evidence that the effect is not totally thermal in nature. Although the reason for the nonthermal effect is not understood with certainty, it is believed that simultaneous generation of thermomechanical stress waves in the semiconductor material or transfer of electron kinetic energy to the semiconductor nuclei is involved in the annealing process.

The parameters that are variable in the pulsed electron beam processing are: (1) the energy spectrum of the pulsed electron beam, (2) the duration of the electron pulses, (3) the total energy per unit area carried to the semiconductor device surface by the electron beam per pulse, and (4) the total number of pulses employed. The energy spectrum of the electron pulse is selected to be sufficiently high in energy so that the entire region to be processed is raised above its minimum process effect temperature without causing melting or fracturing at any position and, at the same time, the maximum electron energy is below the threshold energy for causing atomic displacements in the semiconductor structure. Duration of the electron pulse is sufficiently short so that the deposited energy is not dissipated from the process region during the pulse period, whereby minimum processing temperatures are not presented throughout the region. The total energy deposited per unit area on the semiconductor device by the electron pulse is determined from consideration of the requirements for achieving minimum processing temperatures throughout the implanted region without exceeding thresholds for energy-induced structural damage mechanisms such as vaporization, melting, fracturing, and the like, anywhere in the semiconductor material. It has been found that single pulses are adequate for annealing particular ion implantation conditions in specific semiconductor materials, however, multiple pulses are necessary for completion of other pulsed processes under certain conditions.

Pulsed electrons incident upon a material surface are absorbed as they penetrate the material. Kinetic energy of the electrons is converted to heat in the absorbing material, the heating effect being spatially dependent upon rate and position at which the electron energy is absorbed. As the initial electron energy is decreased, absorption and heating are shifted towards the region near the electron impact surface. The momentary temperature elevation in a region extending from the material surface through an arbitrary selected depth is controlled by varying the pulsed electron beam parameters. The use of the pulsed electron beams for processing of semiconductor devices results in localization of thermal treatment at the necessary region, the treatment being performed in time durations of the order $10^{-1}$ seconds or less. Temperatures achieved depend upon the material and the deposited energy density, and are controlled by selection of the characteristics of the electron pulse. At completion of the electron pulse and the achievement of peak temperature, the temperature profile relaxes back to an equilibrium level with a time constant which depends upon geometry and material characteristics.

Referring now to the drawings, particularly FIG. 1, there is shown a system 10 for thermal processing of semiconductor materials having an electrical conductivity in the approximate range of $10^4$ to $10^{-7}$ ohm$^{-1}$, for example semiconductor materials such as silicon, germanium, gallium arsenide, gallium phosphide, indium phosphide, cadmium telluride, aluminum antimonide, cadmium sulphide, copper oxide and the like. System 10 comprises an electron beam generator 12 and a platform 14 on which there is mounted a semiconductor device 16 in an electron beam chamber 36. Electron beam generator 12 generates a short duration pulsed electron beam 18 that is directed towards semiconductor device 16 for localized thermal processing of specific regions of the semiconductor device, for example, the surface regions. Electron beam generator 12 includes a charging supply 20, an energy storage unit 22, an output switch 24, a cathode diode unit 26 and a transparent anode 28. Charging supply 20 is connected to a charging control 30, which controls the energy spectrum of the electron pulse. Pulse control 32, which is connected to output switch 24, triggers the electron pulse that is directed from cathode 26 to semiconductor device platform 14 through anode 28. Pulse duration is regulated by internal configuration of energy storage unit 22. Energy density at the surface of the semiconductor device 16 is controlled by the geometry of cathode 26, anode 28 and semiconductor device 16. Semiconductor device 16 is carried by platform 14, for example, an XY table, that is movable by means of a controller 34 for proper positioning of semiconductor device 16 with respect to electron beam 18. Semiconductor device 16 is positioned so that electron beam 18 impacts upon the surface being processed. The distance between anode 28 and the surface of semiconductor device 16 is in the approximate range of 0 to 1 meter. Electron beam chamber 36 is evacuated to a pressure consistent with the requirements for generation and propagation of the electron pulse, for example, a vacuum level in the range $10^{-3}$ to $10^{-6}$ torr. By way of example, the ranges of electron pulse parameters are:

| | |
|---|---|
| Pulse duration | $10^{-9} - 10^{-1}$ second |
| Electron energy | $10^3 - 10^6$ eV |
| Electron Fluence | $10^{-3} - 10^2$ cal/cm$^2$ |
| Beam Current | $1 - 10^4$ amp/cm$^2$ |

The impacting electron beam pulse momentarily elevates the temperature of the semiconductor device surface in the region to be processed without subjecting the other portions of the semiconductor device to undesirable and unwanted thermal exposure.

The pulsed electron beam processing of system 10 provides extremely rapid thermal processing of the semiconductor material, high temperatures being maintained in the processed region for time periods as short as microseconds or milliseconds until thermal relaxation has occurred after completion of the electron pulse. In consequence of the high temperatures being produced in only a limited region for only a short period of time, higher peak temperature utilization is more efficient than in conventional thermal processing techniques. In consequence, better effects are achieved.

Several examples of potential applications for the thermal processing techniques herein described includes: (1) electrical activation of dopant ions and annealing of radiation damage following ion implantation processing; (2) annealing and activation of ion implanted region containing a highly mobile ion species such as lithium, which is driven away by conventional elevated temperature annealing; (3) annealing and activation of an ion implantated region sufficiently and rapidly so as to maintain steep atomic concentration gradients by minimizing thermally induced migration; (4) sintering or alloying of metal-semiconductor interfaces to improve electrical contact and/or mechanical adherence; (5) treatments of dielectric coatings to improve optical quality and mechanical adherence; (6) melting and subsequent recrystallization of thin films of semiconductor materials to improve crystalline characteristics without altering the substrate of the films; (7) separation of individual devices from larger area wafers by pulsed induced fracture along prescribed boundaries; (8) the ability to produce local thermal treatment in regions of partially completed devices when the devices as a whole is not able to be subjected to the necessary thermal environment; and (9) processing of semiconductor devices from material to finished device including ion implanted junctions or regions, ohmic or barrier contacts, dielectric or metal coatings, and the like, with the material held at low temperature throughout processing except for local short duration pulsed thermal treatments in selected surface vicinity regions only.

Test results of pulsed annealing of ion implanted layers in silicon are presented in the following table as an example of the effectiveness of the present invention for one processing application.

| Comparison of Furnace and Pulse Anneal Results | | | |
|---|---|---|---|
| | Sheet Resistance $\Omega$/square | | |
| Anneal Condition | P$^{31+}$ Implant 5 × 10$^{14}$ cm$^{-2}$ | P$^{31+}$ Implant 1.5 × 10$^{15}$ cm$^{-2}$ | P$^{31+}$ Implant 5 × 10$^{15}$ cm$^{-2}$ |
| None | >5000 | >5000 | >5000 |
| 500° C for 15 min. | 730 | 730 | 730 |
| 550° C for 15 min. | 410 | 270 | 310 |
| 600° C for 15 min. | 240 | 91 | 77 |
| 650° C for 15 min. | 270 | 140 | 100 |
| 700° C for 15 min. | 210 | 95 | 91 |
| 750° C for 15 min. | 200 | 91 | 81 |
| 0.4 cal cm$^{-2}$ pulse | 400 | 86 | 127 |
| 0.6 cal cm$^{-2}$ pulse | 180 | 68 | 36 |

Silicon: 10 $\Omega$-cm boron doped (111) low dislocation float zone
Furnace Anneal in forming gas
Pulse Anneal in vacuum The introduction of dopant ions into a semiconductor material by ion implantation causes radiation damage in the semiconductor structure and results in a necessity to anneal the implanted region for restoring crystal structure and for achieving high electrical conductivity. The major shortcoming of ion implantation for dopant impurity introduction is the radiation damage to the semiconductor material by the implant ions. The necessity to anneal at high temperatures, which approach diffusion temperatures, has been considered to partially offset the considerable advantages of ion implantation. Although it is possible to implant selected ions into any material at low temperature, the fact that many materials and structures are unable to withstand subsequent annealing without deterioration has prevented the use of ion implantation for many applications. Annealing conditions are usually selected in order to reduce the sheet resistance of the implanted layer to a minimum value.

Figure 2:
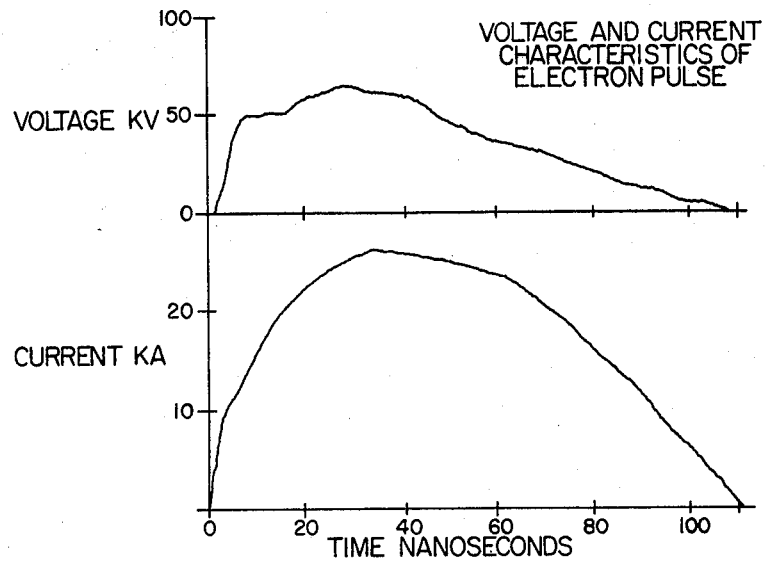
FIG. 2 is a graphical representation of voltage and current versus time characteristics of a particular electron pulse used in one ion implantation damage annealing demonstration.
Figure 3:
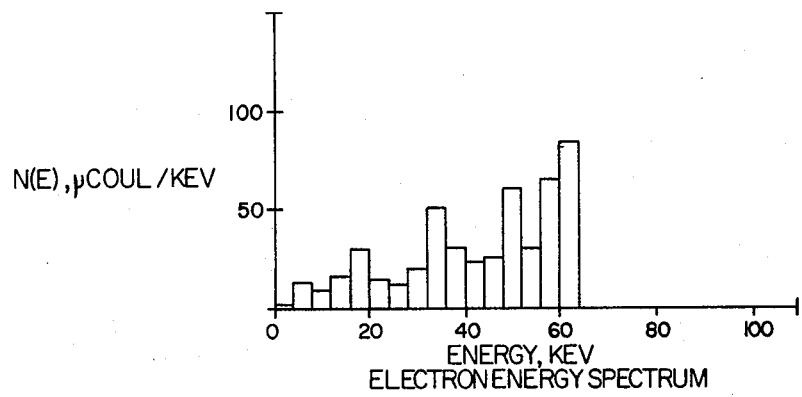
FIG. 3 is a graphical representation of the electron energy spectrum determined for the electron pulse characteristics of FIG. 2.

The results given in the foregoing table are from a test of 10 ohm-cm, p-type boron-doped, (111) oriented, low dislocation density, low oxygen content single crystal silicon samples ion implanted at room temperature with 5 × 10$^{14}$, 1.5 × 10$^{15}$ and 5 × 10$^{15}$ cm$^{-2}$ fluences of 35 keV phosphorus ions. Depth of ion implant was considerably less than 1 $\mu$m. The effects on implanted layer sheet resitance due to single 0.1 $\mu$sec. electron pulses of 0.4 and 0.6 cal/cm$^2$ are comparable to the effects of conventional furnace annealing at temperatures up to 750° C in a 97% nitrogen, 3% hydrogen atmosphere. The 0.4 cal/cm$^2$ electron pulses produced annealing approximately equivalent to that of 550° C to 600° C furnace anneal and the 0.6 cal/cm$^2$ pulses reduced sheet resistances to below the lowest values achieved with furnace annealing. Other tests have confirmed that pulsed electron beam annealing of implanted layers reduces sheet resistance to below minimum values achievable using furnace annealing. At this time, it is not known with certainty why short duration pulsed annealing causes superior electrical conductivity in the implanted region, but it is believed that the effects causing transfer of kinetic energy to atomic nuclei are involved. FIG. 2 is a graphical representation of the experimentally measured current and voltage versus time characteristics of one of the 0.6 cal/cm$^2$ electron pulses used in the test described above. FIG. 3 is a graphical representation of the electron energy spectrum of the electron pulse represented in FIG. 2. FIG. 4 is a graphical representation of the experimentally determined electron pulse deposited dose as a function of depth from the silicon surface for the same electron pulse conditions described above. It will be seen that energy is deposited directly only into approximately the first 13 μm of silicon below the surface. FIG. 5 shows computer calculations of temperature profiles in the silicon due to a 0.6 cal/cm² electron pulse immediately following completion of the particular pulses used above and at intervals 0.5, 1 and 10 μseconds later. The ion implanted layer of depth less than 1 μm is predicted to have reached a maximum temperature exceeding 1200° C, the maximum temperature at a depth of 20 μm did not exceed 200° C. Further reduced maximum temperatures were experienced at greater depths.

As hereinafter described, in conjunction with ion implantation of doping materials, device fabrication is entirely at low temperatures in the pulsed beam thermal processing. Pulsed processing, in conjunction with ion implantation, allows a wide range of devices to be processed entirely in a common vacuum environment. Referring now to FIG. 6, there is shown a system 50 for automated production of semiconductor devices, for example silicon solar cells. System 50 comprises a vacuum chamber 52 having input and output vacuum interlocks 54, 56, an entrance chamber 58, and an exit chamber 59. Silicon wafers to be processed into solar cells are carried through vacuum chamber 52 on an endless moving belt 57. Ion implantation devices 60 and 62, which project into opposite sides of chamber 52 in registration with one another, are provided for front junction ion implantation and back surface underlayer implantation, respectively. Although not shown, it is to be understood that, for other ion species, additional implantation devices are provided. Vacuum evaporation stations 62, 63 and 65, which are disposed within chamber 52, are provided to deposit solar cell front and back contacts and front optical antireflective coatings. Other metal and insulating film sequences are used for different semiconductor devices. A pulsed electron beam generator 66, which projects into chamber 52, is operative to simultaneously pulse anneal the front surface ion implanted region, and pulse sinter the front metal contact film and front surface anti-reflective coating. A pulsed electron beam generator 68, which projects into chamber 52 in registration with generator 66, is operative to simultaneously pulse anneal the solar cell back surface implanted layer and pulse sinter the back surface contact layer. Pulsed electron beam generators 66 and 68, which are located at stations 69 and 71, respectively, are similar in structure and function to pulsed electron beam generator 12. If, prior to processing, the silicon wafer is provided with diamond scribe lines to determine final surface dimensions, fracturing of the silicon along the scribed boundaries occurs during the pulsed electron beam processing at stations 69 and 71, and the completed cell is reduced to final dimensions.

In the above sequence, the silicon wafer is introduced into vacuum chamber 52 at room temperature and is heat sinked on endless belt 57. Heat sinking ensures that the silicon wafer is maintained at essentially room temperature throughout the processing cycle. If heat sinking of the wafer is not provided, a temperature rise in the range of a few degrees Centigrade to several hundred degrees Centigrade is experienced by the cell wafer due to total energy deposited by the individual processing operations, the implantations, evaporations and pulsed electron processes.

Except for wafer preparation prior to insertion into the vacuum processing facility, no additional steps, such as etching, cleaning, masking, layer removal, and the like are necessary. In production, clean polished wafers on endless belt 57 enter vacuum chamber 52 through vacuum interlock 54. The wafers are carried by endless belt 57 to each of the processing devices within the chamber. The wafers emerge in minutes as finished solar cells ready for final test. No manual handling or control is involved. While ion implantation is included in the fabrication sequence, the key to being able to utilize implantation efficiently is the ability to effect annealing of implantation damage by pulsed energy deposition. In one example, for the implantation parameters used to produce a silicon solar cell, pulsed energy annealing is provided by depositing approximately 0.6 cal/cm² into only the first few microns of the implanted surface in a time frame of approximately 0.1 μsecond.

Since certain changes may be made in the foregoing disclosure without departing from the scope of the invention herein involved, it is intended that all matter contained in the above description and shown in the accompanying drawings be construed in an illustrative and not in a limiting sense.

What is claimed is:

1. An apparatus for thermal processing of selected localized regions of a semiconductor, said apparatus comprising:
   (a) beam generator means for generating a short duration pulsed electron beam, said electron beam having a pulse duration in the range of $10^{-9}$ to $10^{-1}$ second, fluence in the range of $10^{-3}$ to $10^2$ cal/cm² and electron energy which is sufficiently high to permit thermal processing of the semiconductor and is sufficiently low as not to create atomic displacements in the semiconductor; and
   (b) position means on which the semiconductor is supported, said semiconductor being disposed in a path along which said electron beam propagates, said short duration pulse impacting upon the selected regions of the semiconductor and momentarily elevating the temperature of the selected regions above a temperature at which the thermal processing effects occurs for a time period of less than one second.

2. An apparatus for thermal processing for selected localized regions of a semiconductor, said apparatus comprising:
   (a) generator means for generating a short duration pulsed beam having a pulse duration in the range of $10^{-9}$ to $10^{-1}$ second and an electron energy which is sufficiently high so as to permit thermal processing of the semiconductor and is sufficiently low as to prevent atomic displacements in the semiconductor; and
   (b) position means on which the semiconductor is supported, said semiconductor being disposed in a path along which said beam propagates, said short duration pulse impacting upon the selected regions of the semiconductor and momentarily elevating the temperature of the selected regions above a temperature at which the thermal processing effect occurs for a time period of less than one second.

3. The apparatus as claimed in claim 2 wherein the fluency of said pulsed beam is in the range of $10^{-3}$ to $10^{-2}$ cal/cm².

4. The apparatus as claimed in claim 2 wherein said pulse duration is approximately $10^{-7}$ second.

5. The apparatus as claimed in claim 2 wherein said beam is a pulsed electron beam having an electron energy in the range of $10^3$ to $10^6$ eV.

* * * * *